US009257671B2

(12) United States Patent
Suzuki et al.

(10) Patent No.: US 9,257,671 B2
(45) Date of Patent: Feb. 9, 2016

(54) RESIN COMPOSITION FOR SEALING ORGANIC ELECTROLUMINESCENT DEVICE; METHOD OF PRODUCING THE SAME; AND ADHESIVE FILM, GAS-BARRIER FILM, ORGANIC ELECTROLUMINESCENT DEVICE AND ORGANIC ELECTROLUMINESCENT PANEL USING THE RESIN COMPOSITION

(71) Applicant: FURUKAWA ELECTRIC CO., LTD., Tokyo (JP)

(72) Inventors: Toshihiro Suzuki, Tokyo (JP); Satoshi Hattori, Tokyo (JP); Tetsuya Mieda, Tokyo (JP); Hideto Fukuda, Tokyo (JP); Takanori Yamakawa, Tokyo (JP); Toshimitsu Nakamura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 14/303,034

(22) Filed: Jun. 12, 2014

(65) Prior Publication Data

US 2014/0291655 A1    Oct. 2, 2014

Related U.S. Application Data

(63) Continuation of application No. PCT/JP2013/059520, filed on Mar. 29, 2013.

(30) Foreign Application Priority Data

Mar. 30, 2012    (JP) ................... 2012-083117

(51) Int. Cl.
*H01L 21/48* (2006.01)
*H01L 23/02* (2006.01)
(Continued)

(52) U.S. Cl.
CPC ........ *H01L 51/5253* (2013.01); *H01L 51/5246* (2013.01); *H01L 51/5259* (2013.01); *H05B 33/04* (2013.01); *H05B 33/10* (2013.01); *Y10T 428/1476* (2015.01)

(58) Field of Classification Search
CPC .... H05B 33/04; H05B 33/10; H01L 51/5246; H01L 51/5259; H01L 51/5253; Y10T 428/1476
USPC .............. 257/40, 59, 79, 678, 684, 687, 702; 438/106, 107, 112, 118, 125, 127; 524/424, 451, 556, 588
See application file for complete search history.

(56) References Cited

U.S. PATENT DOCUMENTS 8,809,442 B2 *    8/2014    Kageyama .................... 524/517
2003/0190763 A1    10/2003    Cok et al.
(Continued)

FOREIGN PATENT DOCUMENTS

JP    2001-237064 A    8/2001
JP    2003-297559 A    10/2003
(Continued)

OTHER PUBLICATIONS

International Search Report, mailed Jul. 2, 2013, issued in PCT/JP2013/059520.
(Continued)

*Primary Examiner* — Hsien Ming Lee
(74) *Attorney, Agent, or Firm* — Birch, Stewart, Kolasch & Birch, LLP

(57) ABSTRACT

A resin composition for sealing an organic electroluminescent device, containing:
  a drying agent, and
  a curable component,
wherein a surface roughness Ra of the shear failure surface after curing the resin composition is 0.5 μm or more; a production method thereof; an adhesive film and a gas-barrier formed of the resin composition; an organic electroluminescent device and an organic electroluminescent panel using the same.

12 Claims, 2 Drawing Sheets

(51) Int. Cl.
*H01L 51/52* (2006.01)
*H05B 33/04* (2006.01)
*H05B 33/10* (2006.01)

(56) References Cited

U.S. PATENT DOCUMENTS

| | | | |
|---|---|---|---|
| 2005/0227082 A1* | 10/2005 | Shimazu et al. | 428/413 |
| 2006/0097633 A1 | 5/2006 | Cho et al. | |
| 2007/0184300 A1 | 8/2007 | Yokose et al. | |

FOREIGN PATENT DOCUMENTS

| | | |
|---|---|---|
| JP | 2004-143310 A | 5/2004 |
| JP | 2004-335208 A | 11/2004 |
| JP | 2005-243556 A | 9/2005 |
| JP | 2006-134888 A | 5/2006 |
| JP | 2006-228519 A | 8/2006 |
| JP | 2007-5107 A | 1/2007 |
| JP | 2008-115383 A | 5/2008 |
| JP | 2009-26648 A | 2/2009 |
| JP | 2009-132876 A | 6/2009 |
| JP | 2009-259656 A | 11/2009 |
| JP | 2010-80293 A | 4/2010 |
| KR | 10-2006-0080220 A | 7/2006 |

OTHER PUBLICATIONS

Korean Office Action dated Aug. 5, 2015, issued in corresponding Korean Patent Application No. 10-2013-7032279 (with English translation).

Extended European Search Report, issued Nov. 9, 2015 in corresponding European Patent Application No. 13769919.5.

* cited by examiner

RESIN COMPOSITION FOR SEALING ORGANIC ELECTROLUMINESCENT DEVICE; METHOD OF PRODUCING THE SAME; AND ADHESIVE FILM, GAS-BARRIER FILM, ORGANIC ELECTROLUMINESCENT DEVICE AND ORGANIC ELECTROLUMINESCENT PANEL USING THE RESIN COMPOSITION

CROSS-REFERENCE TO RELATED APPLICATIONS

This application is a continuation of PCT/JP2013/059520 filed on Mar. 29, 2013 which claims benefit of Japanese Patent Application No. 2012-083117 filed on Mar. 30, 2012, the subject matters of which are incorporated herein by reference in their entirety.

TECHNICAL FIELD

The present invention relates to a resin composition for sealing an organic electroluminescent device that emits a high-intensity luminescence by application of electric field. More minutely, the present invention relates to a resin composition for coating a whole surface of an organic electroluminescent device formed on a substrate in order to protect the organic electroluminescent device from moisture and other substances; a production method thereof; and an adhesive film, a gas-barrier film, an organic electroluminescent device and an organic electroluminescent panel each using the resin composition.

BACKGROUND ART

As a luminescent electronic display, there is an electroluminescent display (ELD). The constituent element of the ELD includes an inorganic or organic electroluminescent device (hereinafter, referred to as an inorganic or organic EL device). The inorganic EL device has been used as a flat-shaped light source, but an alternating high-voltage is needed to drive a light-emitting device. The organic EL device has a constitution in which a light-emitting layer containing a light-emitting compound is sandwiched between a cathode and an anode. The organic EL device emits light using emission of light (fluorescence•phosphorescence) caused by deactivation of excitons that are generated by injecting electrons and positive holes into the light-emitting layer followed by making them recombine. The organic EL device is able to emit light at a voltage of from about several V to about several tens of V. Further, due to a self-luminescent type, the organic EL device has good viewing angle and a high level of visibility, and due to a thin-film type absolute solid-state device, the organic EL device has attracted attention from viewpoints of reduced space and portability.

The organic EL device is a polycrystalline semiconductor device and can emits a high-intensity luminescence with a low voltage. The organic EL device is therefore used for a backlight of the liquid crystal and the like and has been expected to be a thin-flat display device. However, the organic EL device has drawbacks such that due to a terrible susceptibility to moisture, the interface between a metal electrode and an organic EL layer breaks away under the influence of moisture, a metal is oxidized to become highly resistive, an organic component itself becomes modified by moisture, and given this situation, emission of light does not occur or luminance becomes lowered.

The organic EL device has a property such that light-emitting characteristics deteriorate upon exposure to moisture and the like contained in atmospheric air. Therefore, in order to bring the organic EL panel into operation stably for a long time, a sealing structure for blocking the organic EL device from atmospheric air is absolutely imperative. As the sealing structure of the organic EL panel, a structure (hollow sealing structure) in which a sealing member made from metal or glass and a substrate on which an organic EL device has been formed are stuck together to form a sealing space surrounding the organic EL device and further a drying agent is disposed in the sealing space, has been adopted in general. However, in consideration of making the panel more thinner and improving mechanical strength or the like, studies on a solid sealing structure in which the organic EL device is directly coated with a sealing material without a space has been conducted (refer to Patent Literature 1). Further, recently a method is proposed in which a drying agent is added to a sealing material and the resultant material is provided on the organic EL device in the form of lamination, thereby protecting the organic EL device from influence of moisture (refer to Patent Literatures 2 and 3).

However, even in the case of adding a drying agent to a resin as mentioned above, it is impossible to suppress movement of moisture in the resin in a sufficient degree, and it has not sufficiently achieved to improve deterioration due to display defects, so-called dark-spot, in which emission of light is not obtained at the non-luminous point and around the light-emitting face.

CITATION LIST

Patent Literatures

Patent Literature 1: JP-A-2007-5107 ("JP-A" means unexamined published Japanese patent application)
Patent Literature 2: JP-A-2009-26648
Patent Literature 3: JP-A-2004-335208

SUMMARY OF INVENTION

Technical Problem

The present invention addresses the above-described problems and a provision of a resin composition for sealing an organic electroluminescent device, wherein stable light-emitting characteristics of the organic electroluminescent device can be maintained over a long period of time by sealing without causing adverse effect on the organic electroluminescent device, an adhesive film and a gas-barrier film each of which contains the resin composition, and an organic electroluminescent device and an organic electroluminescent panel each using the same.

Solution to Problem

As the result of intensive studies to address the above-described problems, the present inventors found that a surface roughness of the shear failure (fracture) surface of an adhesive layer after curing is important to solve the problems in view of importance of adhesiveness of a drying agent used for reduction of moisture in the adhesive layer and a resin interface. The present invention has been completed based on the above findings.

That is, the above-described problems of the present invention have been solved by the following means.

(1) A resin composition for sealing an organic electroluminescent device, containing:
   a drying agent, and
   a curable component,
wherein a surface roughness Ra of the shear failure surface after curing the resin composition is 0.5 µm or more.
(2) The resin composition for sealing an organic electroluminescent device as described in the above item (1), further containing a binder resin.
(3) The resin composition for sealing an organic electroluminescent device as described in the above item (1) or (2), wherein a mean diameter of the drying agent is from 0.01 to 5 µm.
(4) The resin composition for sealing an organic electroluminescent device as described in the above item (2) or (3), wherein the binder resin is one or more kinds of resins selected from a (meth)acrylic polymer, a rubber-based polymer, a phenoxy resin, a urethane resin, a polyester resin, a polyethylene resin and a polystyrene resin.
(5) The resin composition for sealing an organic electroluminescent device as described in any one of the above items (2) to (4), wherein the binder resin is one or more kinds of resins selected from a (meth)acrylic polymer, a phenoxy resin and a polyester resin.
(6) The resin composition for sealing an organic electroluminescent device as described in any one of the above items (2) to (5), wherein the resin composition is obtained by pulverizing a mixture of the drying agent, the binder resin and a solvent so that a mean diameter of the drying agent becomes 5 µm or less, and then mixing the curable component with the mixture.
(7) An adhesive film containing
   an adhesive layer containing the resin composition for sealing an organic electroluminescent device as described in any one of the above items (1) to (6), and
   a peel sheet temporarily attached onto both or one side of the adhesive layer.
(8) The adhesive film as described in the above item (7), wherein the adhesive film has two or more adhesive layers, at least one of which is the adhesive layer described in the above item (7), and an adhesive layer at the side to which the organic electroluminescent device is adhered does not contain the drying agent.
(9) A gas-barrier film containing the resin composition for sealing an organic electroluminescent device described in any one of the above items (1) to (6).
(10) An organic electroluminescent device sealed with the resin composition for sealing an organic electroluminescent device described in any one of the above items (1) to (6).
(11) An organic electroluminescent panel containing the organic electroluminescent device as described in the above item (10).
(12) A method of producing a resin composition for sealing an organic electroluminescent device, the resin composition containing a drying agent, a curable component and a binder resin, and a surface roughness Ra of the shear failure surface after curing the resin composition being 0.5 µm or more, and the method including the steps of:
   mixing the binder resin and the drying agent in a solvent and pulverizing the mixture using a bead mill so that a mean diameter of the drying agent becomes 5 µm or less to prepare a pre-varnish, and
   mixing the curable component with the pre-varnish.

Effects of Invention

According to the present invention, a resin composition for sealing an organic electroluminescent device, wherein stable light-emitting characteristics of the organic electroluminescent device can be maintained over a long period of time by sealing without causing adverse effect on the organic electroluminescent device, a production method thereof, an adhesive film and a gas-barrier film each of which contains the resin composition, and an organic electroluminescent device and an organic electroluminescent panel each using the same, can be provided.

Other and further features and advantages of the present invention will appear more fully from the following description, appropriately referring to the accompanying drawings.

MODE FOR CARRYING OUT THE INVENTION

Figure 1:
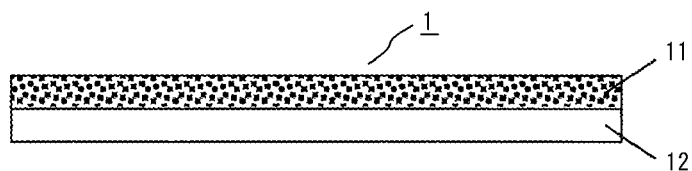
FIG. 1 is a view showing diagrammatically a cross-section of a preferable aspect of the adhesive film for sealing according to the present invention.
Figure 2:
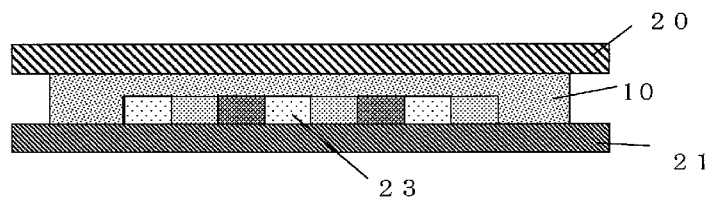
FIG. 2 is a view showing diagrammatically a cross-section of another preferable aspect of the organic electroluminescent device sealed with the adhesive film for sealing according to the present invention.
Figure 3:
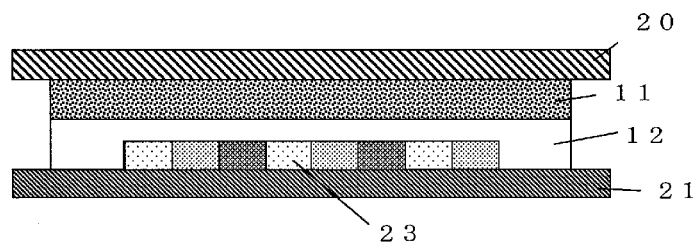
FIG. 3 is a view showing diagrammatically a cross-section of preferable aspect of the organic electroluminescent device sealed with the adhesive film for sealing composed of two adhesive layers according to the present invention.

Hereinafter, the mode for carrying out the present invention is explained in detail.

The resin composition of the present invention is a resin composition for sealing an organic electroluminescent device (organic EL device).

Seal of the organic electroluminescent device is carried out as described below.

First, on a glass or film substrate, a transparent electrode is formed in the form of a film with a thickness of about 0.1 µm. In the film formation of the transparent electrode, there are methods of conducting vacuum deposition, sputtering, or the like. However, the film formation conducted by vacuum deposition sometimes may reduce smoothness of the film surface due to growth of crystal grains. As a result, in the case of applying to a thin film electroluminescence, it may cause breakdown of the film or inhomogeneous emission of light, and attention is therefore required. In contrast, the film formation conducted by sputtering has good smoothness of the surface, and a preferable result is obtained in a case where a thin film device is laminated on the film formed by sputtering. Subsequently, a film of a positive-hole transportation layer and a film of an organic electroluminescent layer each having a thickness of 0.05 µm are successively formed on top of the transparent electrode. Further, a film of a back plate (back plate electrode) with a thickness of from 0.1 to 0.3 µm is formed on the organic electroluminescent layer.

Using a roll laminator or the like, the thermoset resin composition of the present invention is transferred onto the glass or film substrate on which film formation has been finished. At this time, the thermoset resin composition of the present invention is previously spread on a substrate film (mold release film) so as to form a film shape. The film-shaped thermoset resin composition is transferred by means of a roll laminator. Subsequently, a water-impermeable glass or film substrate is superimposed on the transferred thermoset resin composition. This is subjected to thermal compression using a vacuum laminator to perform a tentative fixation of the top and bottom substrates. Then, the laminate is heated and the thermoset resin composition is completely cured at temperature in this heating process. It is preferable to set the temperature of thermoset at 120° C. or below so as to avoid damage of the organic electroluminescent device.

<Resin Composition and Adhesive Layer>

The resin composition of the present invention contains at least a drying agent and a curable component, and a surface roughness Ra of the shear failure surface of the adhesive layer after curing is 0.5 µm or more.

The surface roughness Ra of the shear failure surface is preferably 0.5 µm or more, and 2.0 µm or less; more preferably 0.5 µm or more, and 1.5 µm or less; and still more preferably 0.5 µm or more, and 1.0 µm or less.

It is thought that by reducing adhesion between the drying agent and the resin interface so that the surface roughness Ra becomes 0.5 µm or more, diffusion of water at the interface becomes faster and the drying agent is able to absorb water sufficiently whereby generation of the dark spot can be suppressed.

The surface roughness Ra of the shear failure surface of the adhesive layer after curing can be measured as follows.

(Method of Measuring Surface Roughness Ra of the Shear Failure Surface)

Figure 5:
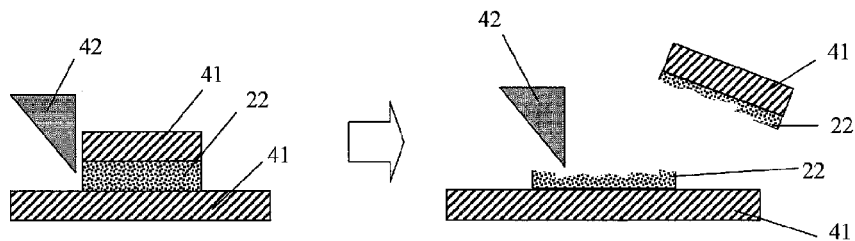
FIG. 5 is a pattern diagram of shear failure for measuring the surface roughness Ra of the shear failure surface.

In the adhesive film having peel sheets on both sides of the adhesive layer having a thickness of 20 µm, a peel sheet provided on a side adhering to the organic electroluminescent device is peeled off, and the adhesive film and a 5 mm-square glass are stuck together while heating at 60° C. Then, after peeling away the peel sheet provided on the adhesive layer at a side adhering to a seal substrate, the adhesive film is compressed onto a 12 mm-square glass under the conditions of 60° C./500 gf/3 s. The thus-prepared sample is subjected to thermal curing at 100° C. in a heating furnace for 3 hours. While horizontally applying a head to the 5 mm-square adhesive film portion of the sample in which glass/adhesive film/glass are laminated in this order, a shear force is applied until breaking and the adhesive film portion is broken down as shown in FIG. 5.

The surface roughness Ra of the broken adhesive film is measured using a surface profile-measuring laser microscope (for example, VF-7500, manufactured by KEYENCE Corporation: a surface profile-measuring laser microscope using the system of irradiating He—Ne laser to a sample surface, and reading the resultant reflection light). The surface roughness Ra means a centerline average roughness Ra, which is calculated in terms of arithmetic average of at least 5 or more portions.

In a case where the adhesive layer has two or more layers, the surface roughness Ra of the shear failure surface is also measured under the condition in which the two or more layers are laminated.

The resin composition of the present invention is a curable type resin composition, and from the viewpoint of handleability, it is preferable to put the resin composition into a semi-cured adhesive film state.

That is, this means to form a film-shaped adhesive layer comprised of the resin composition. It is more preferable from the viewpoint of handleability to temporarily attach a peel sheet onto both or one side of the adhesive layer.

For this reason, the resin composition is explained below in the name of an adhesive layer.

The adhesive layer contains a curable component.

For the purpose of hardening the curable component, various kinds of hardeners may be used arbitrarily.

The thickness of the adhesive layer is preferably from 3 to 100 µm, and more preferably from 5 to 50 µm.

(Binder Resin)

For the purpose of imparting flexibility to a film, a binder resin may be used in the adhesive layer.

Examples of the binder resin include a (meth)acrylic polymer, a rubber-based polymer, a phenoxy resin, a urethane resin, a polyester resin, a polyethylene resin and a polystyrene resin, and the like. These binder resins may be used singly or in combination of two or more kinds.

Among these, a (meth)acrylic polymer, a phenoxy resin and a polyester resin are preferred in the present invention.

As for the (meth)acrylic polymer, a polymer or copolymer containing, as a constituent thereof, a (meth)acrylic acid ester such as butyl(meth)acrylate, ethyl(meth)acrylate, methyl (meth)acrylate, 2-ethylhexyl(meth)acrylate, hydroxymethyl (meth)acrylate, hydroxyethyl(meth)acrylate and the like are preferable. Further, a (meth)acrylic acid or a (meth)acrylic acid ester each of which has a hydroxyl group, a carboxyl group, an epoxy group, a nitro group, or the like may be contained as a constituent thereof. A preparation method of the (meth)acrylic polymer is not particularly limited, and the (meth)acrylic polymer can be synthesized in accordance with an ordinary method such as solution polymerization, emulsion polymerization, suspension polymerization, bulk polymerization, or the like.

The mass-average molecular mass of the (meth)acrylic polymer is preferably 50,000 or more, and more preferably from 100,000 to 1,000,000 in particular. When the mass-average molecular mass is 50,000 or more, flexibility, mechanical strength and tack under the condition that the (meth)acrylic polymer is molded in a sheet shape or film shape are suitable. The mass-average molecular mass indicates a value obtained by measurement in accordance with gel permeation chromatography and then converting the measured value using a standard polystyrene curve.

Further, the glass transition temperature (Tg) of the (meth) acrylic polymer is preferably from −10 to 30° C., and more preferably from 0 to 20° C.

Examples of the phenoxy resin include those having at least one skeleton selected from a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. These phenoxy resins may be used singly or in combination of two or more kinds. The mass-average molecular mass of the phenoxy resin is preferably from 30,000 to 100,000, and more preferably from 40,000 to 80,000.

Specific examples of marketed products of the phenoxy resin include 1256 and 4250 manufactured by Japan Epoxy Resins Co. Ltd. (bisphenol A skeleton-containing phenoxy resin), YX8100 manufactured by Japan Epoxy Resins Co. Ltd. (bisphenol S skeleton-containing phenoxy resin), YX6954 manufactured by Japan Epoxy Resins Co. Ltd. (bisphenol acetophenone skeleton-containing phenoxy resin), PKHH manufactured by Union Carbide Corporation (mass-average molecular mass (Mw) 42600, number-average molecular mass (Mn) 11200), FX280 and FX293 manufactured by Toto Kasei Co. Ltd., YL7553BH30, YL6794, YL7213, YL7290, and YL7482 manufactured by Japan Epoxy Resins Co. Ltd., and the like. Among those, 1256 manufactured by Japan Epoxy Resins Co. Ltd. (bisphenol A skeleton-containing phenoxy resin), YX8100 manufactured by Japan Epoxy Resins Co. Ltd. (bisphenol S skeleton-containing phenoxy resin), YX6954 manufactured by Japan Epoxy Resins Co. Ltd. (bisphenol acetophenone skeleton-containing phenoxy resin), and PKHH manufactured by Union Carbide Corporation (mass-average molecular mass (Mw) 42,600, number-average molecular mass (Mn) 11,200) are preferable.

The polyester resin is obtained by polycondensation of a polycarboxylic acid component and a polyol (glycol) component. Examples of the polycarboxylic acid include known ones such as terephtharic acid, isophtharic acid, orthophtharic acid, succinic acid, adipic acid, sebacic acid, cyclohexane dicarboxylic acid, and trimellitic acid. Besides, examples of the polyol include an aliphatic alcohol such as ethyleneglycol and propyleneglycol, and a polyetherpolyol such as polyethyleneglycol and polypropyleneglycol. The mass-average molecular mass of the polyester resin is preferably from 5,000 to 50,000, and more preferably from 10,000 to 30,000.

Further, the glass transition temperature (Tg) of the polyester resin is preferably from −20 to 80° C., and more preferably from 0 to 60° C.

When the Tg is too high, flexibility of the resin composition tends to deteriorate and, on the contrary, when the Tg is too low, tack of the resin composition becomes high, which may result in deterioration of handleability.

The content of the binder resin in the resin composition is preferably from 10 to 90 parts by mass, and more preferably from 30 to 70 parts by mass, with respect to 100 parts by mass of the solid content (non-volatile content) of the resin composition.

(Curable Component)

The curable component means a composition which causes curing reaction by heat, light, or the like. Specific examples of the curable component include a polyimide resin, a polyamide resin, a polyetherimide resin, a polyamideimide resin, a polyester resin, a polyesterimide resin, a phenoxy resin, a silicone resin, a polysulfone resin, a polyethersulfone resin, a polyphenylenesulfide resin, a polyetherketone resin, a chlorinated polypropylene resin, an acrylic resin, a polyurethane resin, an epoxy resin, a polyacrylamide resin and a melamine resin, each of which is known and used for an adhesive, and a mixture thereof.

Among those, an epoxy compound or resin having an epoxy group (hereinafter, collectively-referred to as an epoxy resin) are preferred in the present invention.

The epoxy resin is not particularly limited, as long as it causes an adhesive action by curing, and it is possible to use an epoxy resin having a difunctional or more polyfunctional group, and preferably a molecular mass or a mass-average molecular mass of less than 5,000 and more preferably less than 3,000. Further, it is possible to use an epoxy resin having a molecular mass of not less than 500 and more preferably not less than 800.

Examples of the epoxy resin include a difunctional epoxy resin and a novolac-type epoxy resin, such as a bisphenol A-type epoxy resin, a bisphenol F-type epoxy resin, a bisphenol S-type epoxy resin, an alicyclic epoxy resin, an aliphatic chain epoxy resin, a phenol novolac-type epoxy resin, a cresol novolac-type epoxy resin, a bisphenol A novolac-type epoxy resin, a diglicidyletherified material of bisphenol, a diglicidyletherified material of naphthalenediol, a diglicidyletherified material of phenols, a diglicidyletherified material of alcohols, and an alkyl-substitution product, halide or hydrogen additive of these materials. Further, it is possible to use a generally-known material such as a multifunctional epoxy resin and a hetero ring-containing epoxy resin. These materials may be used singly or in combination of two or more kinds. Besides, any components other than the epoxy resin may be contained as impurities in the amount which does not interfere with the characteristics. In the present invention, an epoxy resin having at least two epoxy groups is preferred. Particularly preferred are bisphenol-type epoxy resins (p-linked bisphenol- or novolac-type epoxy resin, in which a hydroxyl group of phenol has been etherified with a glicidyl group).

The epoxy equivalent of the epoxy resin is preferably from 100 to 1000 g/eq, and more preferably from 150 to 500 g/eq.

The content of the epoxy resin in the resin composition is preferably from 10 to 70 parts by mass, and more preferably from 20 to 60 parts by mass, with respect to 100 parts by mass of the solid content (non-volatile content) of the entire resin composition.

(Hardener)

As the hardener for the epoxy resin, for example, a phenolic resin can be used. As the phenolic resin, for example, condensation products of phenols such as alkyl phenol, polyphenol, naphthol, or biphenylene with aldehydes are used without any particular limitation. A phenolic hydroxyl group that is contained in these phenolic resins easily causes addition reaction with an epoxy group of the epoxy resin by heat whereby a hardened material having high resistance to impact can be formed.

The hydroxyl equivalent of the phenolic resin is preferably from 50 to 300 g/eq, and more preferably from 95 to 240 g/eq. The content of the phenolic resin is, in terms of epoxy equivalent of the epoxy resin/hydroxyl equivalent of the phenolic resin, preferably from about 0.5 to about 2, and more preferably from about 0.8 to about 1.2.

Besides, as for the phenolic resin, a phenol novolac resin, an o-cresol novolac resin, a p-cresol novolac resin, a t-butylphenol novolac resin, a dicyclopentadiene cresol resin, a polyparavinylphenol resin, a bisphenol A-type novolac resin, a phenol biphenylene resin, modified materials of these resins or the like are preferably used.

As other hardeners, a thermal activity-type latent epoxy resin hardener can be also used.

This hardener is of the type which does not react with an epoxy resin at room temperature, but is activated by heating at the certain temperature or above, thereby reacting with an epoxy resin. As the activation method, there are a method of generating active species (anion, cation) due to chemical reaction by heat; a method of initiating a curing reaction as the result of compatibilization and dissolution of the hardener with an epoxy resin at high temperature, while the hardener is stably dispersed in the epoxy resin at around room temperature; a method of initiating a curing reaction by dissolving out a molecular sieve-inclusion type hardener at high temperature; and a method of using a microcapsule.

Examples of the thermal activity-type latent epoxy resin hardener include various kinds of onium salts, and a high-melting point active hydrogen compound such as a dibasic acid dihydrazide compound, dicyan diamide, an amine adduct hardener and an imidazole compound.

(Curing Accelerator)

Further, a curing accelerator may be also used as an auxiliary agent. The curing accelerator which can be used in the present invention is not particularly limited and, for example, a tertiary amine, imidazoles, a quaternary ammonium salt and the like may be used. Examples of the imidazoles which can be preferably used in the present invention include 2-methylimidazole, 2-ethyl-4-methylimidazole, 1-cyanoethyl-2-phenylimidazole, and 1-cyanoethyl-2-phenylimidazolium trimellitate. These may be used singly or in combination of two or more kinds. The imidazoles are marketed under the trade names of 2E4MZ, 2PZ, 2PZ-CN, and 2PZ-CNS, each of which is manufactured by Shikoku Chemicals Corporation.

The content of the curing accelerator is preferably from 0.02 to 5 parts by mass, and more preferably from 0.1 to 2 parts by mass, with respect to 100 parts by mass of the epoxy resin.

(Drying Agent)

Addition of a drying agent is preferred in order to reduce moisture and to make transmission of humidity low. In the present invention, a drying agent is contained in at least one adhesive layer. Herein, regarding the state of the drying agent-containing adhesive layer to be obtained, it is preferable that adhesion of the drying agent and resin interface is weakened. When adhesion of the drying agent/resin interface is strong, diffusion of water in the drying agent/resin interface of the adhesive layer becomes slow and, as a result, water is easy to remain in the resin of the adhesive layer and water becomes difficult to diffuse into the drying agent surface, and the drying agent cannot absorb water sufficiently. Further, because water absorption power of the drying agent becomes low, water becomes easy to penetrate and consequently achievement of low transmission of humidity also becomes difficult. In contrast, when adhesion of the drying agent/resin interface is weak, diffusion of water at the interface becomes fast and the drying agent is able to absorb water sufficiently. As a result, the drying agent absorbs moisture in the resin of the adhesive layer whereby moisture in the resin reduces, which results in suppression of damage to the organic electroluminescent device. Besides, because water absorption power of the drying agent becomes high, water becomes difficult to penetrate and this permits a low transmission of humidity.

The drying agent is not particularly limited, and examples thereof include a metal oxide such as silica gel, molecular sieve, magnesium oxide, calcium oxide, barium oxide, and strontium oxide. Among these, magnesium oxide and calcium oxide are preferred. These drying agents are preferably particles having mean diameter in the range of from 0.01 to 10 μm, more preferably from 0.01 to 5 μm, and still more preferably from 0.1 to 5 μm. When the mean diameter is less than 0.01 μm, in a case where adhesion of the drying agent/resin interface is weak, the mechanical strength of the adhesive layer after curing reduces and this may cause a problem. Besides, when the mean diameter becomes more than 10 μm, this may cause problems such that, when molded into a film-shape, a smooth surface cannot be obtained and a water-absorption power of the drying agent cannot be obtained.

The content of the drying agent in terms of a solid content (non-volatile content) is preferably from 5 to 50 parts by mass, and more preferably from 10 to 40 parts by mass, with respect to 100 parts by mass of the entire resin composition.

The present invention addresses the problem of dark spot by means of weakening adhesion of the drying agent/resin interface so that a surface roughness Ra of the shear failure surface is 0.5 μm or more, which result in bringing out sufficiently a water-absorption power of the drying agent.

To weaken adhesion of the drying agent/resin interface and to control the surface roughness Ra of the shear failure surface to 0.5 μm or more can be achieved by appropriately altering the kind of a resin and a drying agent and a method of adding the drying agent.

Specifically, adjustment of adhesion can be achieved by a method of using a binder resin (for example, an acrylic polymer; a phenoxy resin and a polyester resin, each of which has a molecular mass of from 10,000 to 100,000) and a drying agent (for example, a drying agent composed of a metal oxide such as magnesium oxide or calcium oxide), and then pulverizing both the binder resin and the drying agent in a state of mixture thereof with solvent-diluting, using a bead mill until the mean diameter of the drying agent becomes 5 μm or less (preferably from 0.01 to 5 μm, and more preferably from 0.5 to 5 μm), thereby preparing a pre-varnish, and then preparing the final adhesive varnish by mixing with a cure component, or using an epoxy resin having a high epoxy equivalent (400 to 800 g/eq) and an epoxy resin having a low epoxy equivalent (150 to 300 g/eq) in combination; or the like. By mixing the binder resin with the metal oxide first, and then pulverizing them, a state in which the metal oxide surface is coated with a binder resin that has inferior adhesiveness is created, and consequently adhesion of the drying agent/resin interface becomes weak. As for the epoxy resin, by using an epoxy resin having a high epoxy equivalent in combination, adhesiveness of the epoxy resin and the drying agent interface after curing can be made weak, and consequently adhesion of the drying agent/resin interface becomes weak. Herein, when an epoxy resin having a low epoxy equivalent is used singly, this embodiment is not suitable because adhesiveness of the epoxy resin and the drying agent interface after curing becomes strong. Besides, when an epoxy resin having a high epoxy equivalent is used singly, this embodiment sometimes may cause a problem in terms of adhesiveness.

(Other Additives)

A silane coupling agent may be contained in the adhesive layer.

Specific examples of the silane coupling agent include silane coupling agents such as 3-glycydoxypropyltrimethoxysilane, 3-glycydoxypropylmethyldimethoxysilane, 3-glycydoxypropylmethyldimethoxysilane, 2-(3,4-epoxycyclohexyl)ethyltrimethoxysilane, N-phenyl-γ-aminopropyltrimethoxysilane, N-(2-aminoethyl) 3-aminopropylmethyldimethoxysilane, N-(2-aminoethyl) 3-aminopropylmethyltrimethoxysilane, 3-aminopropyltriethoxysilane, 3-mercaptopropyltrimethoxysilane, vinyltrimethoxysilane, N-(2-vinylbenzylamino)ethyl) 3-aminopropyltrimethoxysilane hydrochloride salt, and 3-methacryloxypropyltrimethoxysilane. Two or more kinds of these silane coupling agents may be mixed. Among these, 3-glycydoxypropyltrimethoxysilane (KBM-403, manufactured by Shin-Etsu Chemical Co., Ltd.) is preferable because the same has good compatibility with an epoxy resin and is excellent in stability. The content of the silane coupling agent in terms of a solid content (non-volatile content) is preferably from 0.02 to 5 parts by mass, and more preferably from 0.1 to 2 parts by mass, with respect to 100 parts by mass of the entire resin composition (except for a drying agent).

In the present invention, it is also possible to add other ingredients, for example, a storage stabilizer, an anti-oxidant, a plasticizer, a tack-adjusting agent, a resin stabilizer and the like, as long as the purpose of the present invention can be achieved. However, attention to moisture and impurities in these addition ingredients is required.

<Peel Sheet>

In the present invention, when the above-described resin composition is molded into an adhesive film-shape, it is preferable to adopt a configuration in which a peel sheet is temporarily attached to one or both sides of an adhesive layer composed of the resin composition.

The peel sheet is used for the purpose of improving handleability of the adhesive film, and also for the purpose of protecting the adhesive layer.

Examples of the peel sheet include a polyethylene film, a polypropylene film, a polybutene film, a polybutadiene film, a polymethylpentene film, a polyvinyl chloride film, a vinyl chloride copolymer film, a polyethyleneterephthalate film, a polyethylenenaphtharate film, a polybutyleneterephthalate film, a polyurethane film, an ethylene/vinyl acetate copolymer film, an ionomer resin film, an ethylene/(metha) acrylic acid copolymer film, an ethylene/(metha) acrylic acid ester copolymer film, a polystyrene film, a polycarbonate film, a polyimide film, and a fluorine resin film. Besides, cross-linked films of these films are also used. Further, laminate films of these films may be also used. Especially, a polyethyleneterephthalate film is preferably used from the viewpoints of cost and handleability.

The surface tension of the peel sheet is preferably 40 mN/m or less, and more preferably 35 mN/m or less. The peel sheet having such low surface tension can be obtained by selecting appropriately quality of the material. Further, the low-surface tension peel sheet can be also obtained by subjecting it to a release processing by coating a silicone resin or the like on a surface of the sheet.

The peel force at the time when an adhesive layer is peeled from the peel sheet is, for example, preferably 0.3 N/20 mm or less, and more preferably 0.2 N/20 mm. Although the peel force has no particular lower limit, 0.005 N/20 mm or more is practical. Further, in a case where a peel sheet is temporarily attached to both sides of the adhesive layer, it is preferable to use peel sheets having peel forces which are different from one another for the purpose of improving handleability.

The thickness of the peel sheet is ordinarily from 5 to 300 μm, preferably from 10 to 200 μm, and particularly preferably from about 20 μm to about 100 μm.

<Adhesive Film>

The adhesive film according to the present invention contains at least one adhesive layer, and has preferably the above-described peel sheet in both sides or one side of the adhesive layer.

The adhesive film may have two or more adhesive layers, and also may have layers other than the adhesive layer.

In the case of having two or more layers, two or more layers are preferably adhesive layers. In this case, it is preferable that both an outermost layer at the side which adheres to an organic electroluminescent device and an outermost layer at the side which adheres to a substrate are adhesive layers.

Further, in a case where the adhesive film has two or more layers, at least one of the two or more layers is the adhesive layer containing a drying agent according to the present invention, and it is preferable that the layer at the side which adheres to an organic electroluminescent device does not contain any drying agent. Herein, in a case where two or more layers are adhesive layers, it is particularly preferable that an outermost layer at the side which adheres to an organic electroluminescent device is an adhesive layer which does not contain any drying agent, and an outermost layer at the side which adheres to a substrate is an adhesive layer which contains a drying agent according to the present invention.

Herein, the thickness of the adhesive layer is ordinarily from 3 to 100 μm, and preferably from 5 to 50 μm. However, in a case where two or more layers are adhesive layers, the thickness of an outermost layer at the side which adheres to an organic electroluminescent device is preferably from 1 to 15 μm, and more preferably from 2 to 10 μm. Besides, the thickness of the adhesive layer of the present invention of an outermost layer containing a drying agent at the side which adheres to a substrate is preferably from 5 to 50 μm, and more preferably from 10 to 20 μm. Further, it is preferable that the thickness of the adhesive layer of the present invention of an outermost layer containing a drying agent at the side which adheres to a substrate is thicker than the adhesive layer at the side which adheres to an organic electroluminescent device.

Herein, as for the adhesive layer of an outermost layer at the side which adheres to an organic electroluminescent device, any adhesive layer is acceptable, as long as it does not contain any drying agent. However, the above-described adhesive layer is preferable, except that the adhesive layer does not contain any drying agent.

In a case where a drying agent is contained, a high-hardness inorganic substance sometimes may emerge on the adhesive layer surface in the form of microscopic protrusions. As a result, these protrusions damage to an electrode layer or the like of the organic electroluminescent device and give rise to causes such as leak current, which results in creating problems of reduction in luminescence performance of the organic electroluminescent device. In contrast, by the configuration that an outermost layer at the side which adheres to an organic electroluminescent device does not contain a drying agent, and an outermost layer at the side which adheres to a substrate contains a drying agent, damage to the organic electroluminescent device can be reduced.

The resin composition of the present invention may contain a solvent in the process of obtaining an adhesive film containing an adhesive layer.

Examples of the solvent include: an organic solvent such as methylethyl ketone, toluene, ethanol, and isopropanol; and water. Among these, the organic solvent is preferable. Methylethyl ketone and toluene are especially preferred. To the solvent, individual materials to be contained in the resin composition are added and then mixed and dispersed. The obtained adhesive varnish (dispersion liquid) is coated directly or by transfer on the peel sheet surface at the side to be peeled, in accordance with a generally known method such as a roll knife coater, a gravure coater, a die coater, and a reverse coater, and then dried whereby an adhesive layer can be obtained.

The adhesive film of the present invention is not only moisture-resistant as described above, but also has high-gas barrier properties against gas such as steam gas, carbon dioxide, and oxygen gas. Thus, the adhesive film is also useful for a gas barrier film due to its functions as a gas barrier film.

<Organic Electroluminescent Device and Organic Electroluminescent Panel>

The organic electroluminescent device of the present invention has a structure in which the organic electroluminescent device has been sealed with the resin composition or the adhesive film of the present invention.

Figure 4:
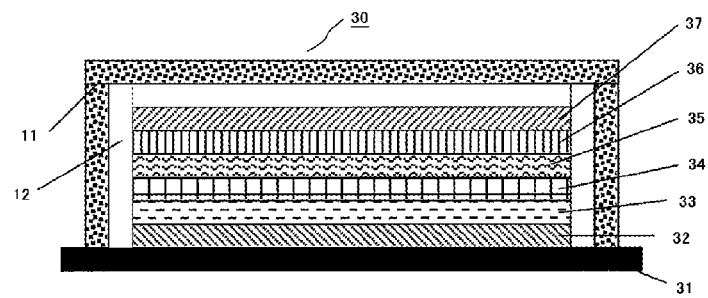
FIG. 4 is a view showing diagrammatically a cross-section of another preferable aspect of the organic electroluminescent device sealed with the adhesive film for sealing composed of two adhesive layers according to the present invention.

A preferable embodiment of the organic electroluminescent device of the present invention is shown in FIG. 4. FIG. 4 shows an organic electroluminescent device containing Substrate (31), and having thereon in the following order, anode (32), positive-hole injection layer (33), positive-hole transportation layer (34), light-emitting layer (35), electron injection layer (36) and cathode (37). Such device is sealed with the seal material of the present invention whereby airtightness is enhanced. Further, the adhesive film (adhesive layer) shown in FIG. 4 has a two-layer structural adhesive layer. The two adhesive layers are disposed so that drying agent-containing adhesive layer (11) is located outside, while drying agent-free adhesive layer (12) is located inside, and disposed in close contact with the organic electroluminescent device so that the two adhesive layers cover anode (32), positive-hole injection layer (33), positive-hole transportation layer (34), light-emitting layer (35), electron injection layer (36) and cathode (37). The configuration of the organic electroluminescent device of the present invention is not limited to the above-described one, but any device is encompassed in the organic electroluminescent device of the present invention, as long as it functions as an organic electroluminescent device and also it is sealed with a seal material of the present invention.

The organic electroluminescent device of the present invention is excellent in airtightness and is more efficiently prevented from performance degradation.

The present invention will be described in more detail based on examples given below, but the invention is not meant to be limited by these.

EXAMPLES

Examples 1 to 8 and Comparative Examples 1 to 3

Preparation of Adhesive Film

To the resin composition having the composition shown in the following Tables 1 and 2, methylethyl ketone was added and mixed while stirring to prepare an adhesive varnish. Depending on the kind of a drying agent, the drying agent was mixed with a binder resin before preparation of the adhesive varnish, and the mixture which was pulverized by means of a bead mill was used. The resin composition shown in the following Table 1 contains the drying agent and forms an adhesive layer to be adhered to the seal substrate side. On the other hand, the resin composition shown in the following Table 2 does not contain any drying agent and forms an adhesive layer to be adhered to the organic electroluminescent device side.

The prepared adhesive varnish of the resin composition shown in the following Table 1 was coated on a peel sheet so that the thickness after drying was 15 μm, and dried at 110° C. for 3 minutes to prepare an adhesive layer. Subsequently, the prepared adhesive varnish of the resin composition shown in the following Table 2 was coated on another peel sheet so that the thickness after drying was 5 μm, and dried at 110° C. for 2 minutes and then the coated resin composition and the adhesive layer shown in the following Table 1 were stuck together so as to have the configurations shown in the following Tables 3 and 4 thereby preparing an adhesive film in which the peel sheet/the resin composition shown in the following Table 1/the resin composition shown in the following Table 2/the peel sheet were superimposed in this order. Thus, the adhesive films of Examples 1 to 7 and Comparative Examples 1 to 3 were prepared. Further, in Example 8, the resin composition shown in the following Table 1 was coated so that the thickness after drying was 20 μm and then the coated resin composition as it is and a peel sheet were stuck together to prepare an adhesive film.

Herein, each component composition of the adhesive resin composition is as follows.

Binder Resin
    A1 Acrylic polymer: Mass-average molecular mass of 800,000, Glass transition temperature (Tg) of 5° C.
    A2 Phenoxy resin: Bisphenol A type resin Mass-average molecular mass of 50,000
    A3 Polyester resin: Mass-average molecular mass of 30,000, Glass transition temperature (Tg) of 5° C.

Curable Component
    B1 Epoxy resin: Liquid bisphenol F type resin Epoxy equivalent is from 160 to 190 g/eq
    B2 Epoxy resin: Bisphenol A type resin Epoxy equivalent is from 450 to 500 g/eq Hardener
    C1 Hardener: Phenol aralkyl type phenol resin Hydroxy equivalent of 172 g/eq Curing Accelerator
    D1 Curing accelerator: 2-Phenylimidazole Drying Agent
    E1 Drying agent: Calcium oxide Mean diameter of 2 μm
    E2 Drying agent: Calcium oxide Mean diameter of 1 μm (mixed with a binder resin, pulverization)
    E3 Drying agent: Magnesium oxide Mean diameter of 0.5 μm (mixed with a binder resin, pulverization)
    E4 Drying agent: Magnesium oxide Mean diameter of 2 μm (mixed with a binder resin, pulverization)

Herein, as for the above-described E2, E3 and E4, the drying agent was mixed with a binder resin in first, and then pulverized using a bead mill so as to be the above-described mean diameter.

TABLE 1

| | Adhesive resin composition | | | | | | | | |
|---|---|---|---|---|---|---|---|---|---|
| | 1A | 1B | 1C | 1D | 1E | 1F | 1G | 1H | 1I |
| A1 Acrylic polymer | 100 | | | 100 | 100 | | | | |
| A2 Phenoxy resin | | 100 | | | | 100 | 100 | | |
| A3 Polyester resin | | | 100 | | | | | 100 | 100 |
| B1 Epoxy resin | 60 | 60 | 30 | 60 | 30 | 30 | 30 | 15 | 15 |
| B2 Epoxy resin | | | | | 30 | 30 | 30 | 15 | 15 |
| C1 Hardener | 60 | 60 | 30 | 60 | 40 | 40 | 40 | 20 | 20 |
| D1 Curing accelerator | 1 | 1 | 0.5 | 1 | 1 | 1 | 1 | 0.5 | 0.5 |
| E1 Calcium oxide | 80 | 80 | 60 | | | | | | |
| E2 Calcium oxide | | | | 80 | 80 | 80 | | | |
| E3 Magnesium oxide | | | | | | | 80 | 60 | |
| E4 Magnesium oxide | | | | | | | | | 60 |

TABLE 2

| | Adhesive resin composition | | |
|---|---|---|---|
| | 2A | 2B | 2C |
| A1 Acrylic polymer | 100 | | |
| A2 Phenoxy resin | | 100 | |
| A3 Polyester resin | | | 100 |
| B1 Epoxy resin | 60 | 60 | 30 |
| C1 Hardener | 60 | 60 | 30 |
| D1 Curing accelerator | 1 | 1 | 0.5 |

(Measurement Method for Surface Roughness Ra of Shear Failure Surface)

As described above, after peeling the peel sheet at the side which adheres to an organic electroluminescent device, the adhesive film of each of Examples and Comparative Examples, and a 5 mm-square glass were stuck together while heating at 60° C. Then, after peeling the peel sheet of the adhesive layer at the side which adheres to a seal substrate, the adhesive film was adhered to a 12 mm-square glass by pressure bonding under the conditions of 60° C./500 gf/3 s. The thus-prepared samples were heated and cured in a heating furnace at 100° C. for 3 hours. Using a bond tester (Bondtester 4000 and Probe: DAGE DS100, manufactured by Dage Japan Co., Ltd.), a head was applied horizontally to a 5 mm-square adhesive film portion of the sample in which glass/adhesive film/glass were superposed in this fashion and a shear force was applied thereto under the conditions of the height of the head tip of 10 μm from the stage and the test speed of 50 μm/sec, until the adhesive film portion was broken down thereby. As a result, the adhesive film was broken down as shown in FIG. 5.

The surface of the broken adhesive film was measured to obtain the surface roughness Ra using a surface profile measuring laser microscope (VF-7500 manufactured by KEYENCE Corporation: a surface profile measuring microscope using the system of irradiating a He—Ne laser onto a sample surface and reading the resultant reflected light). Herein, measurement was conducted under the conditions of measuring magnification: 2500 times, Pich: 0.1 μm, and Z-dist: 50 μm, and an arithmetic average of the portions at 6 points was calculated.

In a case where there are two or more adhesive layers, the surface roughness Ra of shear failure surface shall be also measured under the condition that the two or more adhesive layers has been superposed.

(Evaluation of Dark Spot)

After peeling the peel sheet at the seal substrate side of an adhesive film, the adhesive film and the seal substrate were stuck together while heating at 60° C. using a roll laminator. After sticking them together, a peel sheet at the organic electroluminescent device side of the adhesive film was peeled. Then, to a substrate of the light-emitting side on which the organic electroluminescent device is formed, the adhesive film was adhered by thermal compression bond under the conditions of 80° C./0.1 MPa/30 sec, using a vacuum laminator (a compact-size compression-type vacuum laminator Model V130, manufactured by Nichigo-Morton Co., Ltd.). Then, the adhesive layer was heated and cured in a heating furnace at 100° C. for 3 hours. Thus, the organic electroluminescent panel was prepared and growth of dark spot was observed under the circumstances of 85° C. and relative humidity of 85% while lighting up in a continuous manner. In observation after the lapse of 1000 hours, in the case where a dark spot of 100 μm or more is not found, the dark spot is judged as "none", whereas in the case where a dark spot of 100 μm or more is found, the dark spot is judged as "presence".

The obtained results are shown together in the following Tables 3 and 4.

TABLE 3

|  | Ex 1 | Ex 2 | Ex 3 | Ex 4 | Ex 5 | Ex 6 | Ex 7 | Ex 8 |
|---|---|---|---|---|---|---|---|---|
| Adhesive resin composition at seal substrate side | 1D | 1E | 1F | 1G | 1H | 1I | 1I | 1H |
| Thickness after drying | 15 μm | 15 μm | 15 μm | 15 μm | 15 μm | 15 μm | 15 μm | 20 μm |
| Adhesive resin composition at organic electroluminescent device side | 2A | 2B | 2B | 2B | 2C | 2C | 2A | |
| Thickness after drying | 5 μm | 5 μm | 5 μm | 5 μm | 5 μm | 5 μm | 5 μm | |
| Surface roughness Ra (μ/m) | 0.50 | 0.53 | 0.58 | 0.70 | 0.68 | 0.70 | 0.77 | 0.95 |
| Dark spot | None | None | None | None | None | None | None | None |

"Ex" means Example.

TABLE 4

|  | Comp ex 1 | Comp ex 2 | Comp ex 3 |
|---|---|---|---|
| Adhesive resin composition at seal substrate side | 1A | 1B | 1C |
| Thickness after drying | 15 μm | 15 μm | 15 μm |
| Adhesive resin composition at organic electroluminescent device side | 2A | 2A | 2A |
| Thickness after drying | 5 μm | 5 μm | 5 μm |
| Surface roughness Ra (μ/m) | 0.32 | 0.36 | 0.40 |
| Dark spot | Presence | Presence | Presence |

"Comp ex" means Comparative Example

As is apparent from the above-described Tables 3 and 4, in Comparative Examples 1 to 3, the surface roughness Ra is small, and water absorption power of the drying agent is not enough, and as a result, the dark spot generated. In contrast, in Examples 1 to 8, because the surface roughness Ra is 0.5 μm or more, good results were obtained such that water absorption power of the drying agent was enough, and as a result, no dark spot generated.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2012-083117 filed in Japan on Mar. 30, 2012, which is entirely herein incorporated by reference.

REFERENCE SIGNS LIST

1 Adhesive film (adhesive layer)
10 Organic thin film (adhesive layer)
11 Drying agent-containing adhesive layer
12 Drying agent-free adhesive layer
20 Seal substrate
21 Substrate of light-emitting side
22 Adhesive film
23 Organic electroluminescent device
30 Sealed organic electroluminescent device
31 Substrate
32 Anode
33 Positive-hole injection layer 34 Positive-hole transportation layer
35 Light-emitting layer
36 Electron injection layer
37 Cathode
41 Glass
42 Head

The invention claimed is:

1. A resin composition for sealing an organic electroluminescent device, comprising:
   a drying agent, and
   a curable component,
wherein a surface roughness Ra of a shear failure surface after curing the resin composition is 0.5 μm to 2.0 μm.

2. The resin composition for sealing an organic electroluminescent device according to claim 1, further comprising a binder resin.

3. The resin composition for sealing an organic electroluminescent device according to claim 1, wherein a mean diameter of the drying agent is from 0.01 μm to 5 μm.

4. The resin composition for sealing an organic electroluminescent device according to claim 2, wherein the binder resin is one or more kinds of resins selected from the group consisting of a (meth)acrylic polymer, a rubber-based polymer, a phenoxy resin, a urethane resin, a polyester resin, a polyethylene resin and a polystyrene resin.

5. The resin composition for sealing an organic electroluminescent device according to claim 2, wherein the binder resin is one or more kinds of resins selected from the group consisting of a (meth)acrylic polymer, a phenoxy resin and a polyester resin.

6. The resin composition for sealing an organic electroluminescent device according to claim 2, wherein the resin composition is obtained by pulverizing a mixture of the drying agent, the binder resin and a solvent so that a mean diameter of the drying agent becomes 5 μm or less, and then mixing the curable component with the mixture.

7. An adhesive film comprising:
   an adhesive layer comprising the resin composition for sealing an organic electroluminescent device according to claim 1, and
   a peel sheet temporarily attached onto both or one side of the adhesive layer.

8. The adhesive film according to claim 7, wherein the adhesive film comprises at least one additional adhesive layer, and an adhesive layer at a side to which the organic electroluminescent device is adhered does not contain the drying agent.

9. A gas-barrier film comprising the resin composition for sealing an organic electroluminescent device according to claim 1.

10. An organic electroluminescent device sealed with the resin composition for sealing an organic electroluminescent device according to claim 1.

11. An organic electroluminescent panel comprising the organic electroluminescent device according to claim 10.

12. A method of producing a resin composition for sealing an organic electroluminescent device, the resin composition comprising a drying agent, a curable component and a binder resin, and a surface roughness Ra of a shear failure surface after curing the resin composition being 0.5 μm to 2.0 μm, and the method comprising the steps of:
   mixing the binder resin and the drying agent in a solvent and pulverizing the mixture using a bead mill so that a mean diameter of the drying agent becomes 5 μm or less to prepare a pre-varnish, and
   mixing the curable component with the pre-varnish.

* * * * *